(12) United States Patent
Tanaka et al.

(10) Patent No.: US 9,805,930 B2
(45) Date of Patent: Oct. 31, 2017

(54) METHOD OF MANUFACTURING NITRIDE SEMICONDUCTOR DEVICE USING LAMINATED CAP LAYERS

(71) Applicant: FUJI ELECTRIC CO., LTD., Kanagawa (JP)

(72) Inventors: Ryo Tanaka, Santa Barbara, CA (US); Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/196,035

(22) Filed: Jun. 29, 2016

(65) Prior Publication Data

US 2017/0062220 A1    Mar. 2, 2017

(30) Foreign Application Priority Data

Aug. 25, 2015  (JP) ................. 2015-166010

(51) Int. Cl.
  *H01L 21/00* (2006.01)
  *H01L 21/18* (2006.01)
  *H01L 21/02* (2006.01)
(52) U.S. Cl.
  CPC ........ *H01L 21/187* (2013.01); *H01L 21/0254* (2013.01); *H01L 21/02694* (2013.01)
(58) Field of Classification Search
  CPC ............... H01L 21/187; H01L 21/0254; H01L 21/02694

USPC ........................................................ 438/455
See application file for complete search history.

(56) References Cited

U.S. PATENT DOCUMENTS

| | | | | |
|---|---|---|---|---|
| 6,767,798 B2* | 7/2004 | Kalnitsky | ........... | H01L 21/8249 257/E21.371 |
| 8,952,419 B2* | 2/2015 | Tak | .................. | H01L 21/02381 257/11 |
| 2011/0092057 A1* | 4/2011 | Suvorov | ............. | H01L 21/0465 438/522 |
| 2013/0277684 A1* | 10/2013 | Araki | .................. | H01L 21/0243 257/76 |
| 2014/0073118 A1* | 3/2014 | Horie | .................. | H01L 21/0254 438/478 |
| 2014/0209862 A1* | 7/2014 | Ikuta | ................. | H01L 29/66462 257/22 |

(Continued)

FOREIGN PATENT DOCUMENTS

| | | | |
|---|---|---|---|
| JP | H08-186332 A | | 7/1996 |
| JP | 2540791 B2 | | 10/1996 |
| JP | 2009-290160 A | | 12/2009 |

*Primary Examiner* — Caleb Henry

(57) ABSTRACT

A method of manufacturing a nitride semiconductor device is provided, comprising: forming, on a substrate, a first laminated body where a first nitride semiconductor layer, a second nitride semiconductor layer and a third nitride semiconductor layer are laminated in this order; subsequent to the forming, removing a partial region of the third nitride semiconductor layer, subsequent to the removing; implanting ions to the first nitride semiconductor layer from the partial region where the third nitride semiconductor layer is removed at least through the second nitride semiconductor layer; and subsequent to the implanting the ions, annealing the first laminated body.

12 Claims, 21 Drawing Sheets

(56) References Cited

U.S. PATENT DOCUMENTS

| | | | |
|---|---|---|---|
| 2014/0318441 A1* | 10/2014 | Horie | C30B 25/02 117/94 |
| 2015/0079769 A1* | 3/2015 | Kim | H01L 29/2003 438/478 |
| 2015/0087137 A1* | 3/2015 | Yoon | H01L 21/0242 438/478 |
| 2015/0180203 A1* | 6/2015 | Kinugawa | H01S 5/162 372/45.01 |
| 2015/0357419 A1* | 12/2015 | Lutgen | H01L 21/0254 257/22 |
| 2016/0099345 A1* | 4/2016 | Ramer | H01L 29/78 257/76 |
| 2016/0197151 A1* | 7/2016 | Han | H01L 21/306 257/76 |
| 2016/0268134 A1* | 9/2016 | Isobe | H01L 29/2003 |

* cited by examiner

S50

S50

METHOD OF MANUFACTURING NITRIDE SEMICONDUCTOR DEVICE USING LAMINATED CAP LAYERS

The contents of the following Japanese patent application are incorporated herein by reference:
No. 2015-166010 filed in JP on Aug. 25, 2015.

BACKGROUND

1. Technical Field

The present invention relates to a method of manufacturing a nitride semiconductor device.

2. Related Art

Conventionally, a p-gallium nitride (p-GaN) layer has been formed by MOCVD (Metal Organic Chemical Vapor Deposition).
After providing a cap layer such as an AlN layer on this p-GaN layer, impurity elements have been activated by annealing the p-GaN layer at a high temperature of 400° C. to 1000° C., (for example, refer to Patent Documents 1 and 2). Also, conventionally, in order to prevent a SiC (Silicon Carbide) substrate from breaking up during the annealing, a laminated body with two layers, which are made of graphite and the like and have different crystal structures from each other, has been used as a cap layer (for example, refer to Patent Document 3).

PRIOR ART DOCUMENT

Patent Document

Patent Document 1: Japanese Patent No. 2540791
Patent Document 2: Japanese Patent Application Publication No. H08-186332
Patent Document 3: Japanese Patent Application Publication No. 2009-290160

SUMMARY

Even when forming an impurities region by performing ion implantation of p type impurities to an n-gallium nitride (n-GaN) layer, an annealing using a cap layer is required. After performing the ion implantation of the p type impurities, a surface of the n-GaN layer is roughened. Therefore, it is difficult to form an AlN layer which has enough thickness as an effective cap layer on the n GaN layer.
Also, in a case where a two-layer laminated body of the AlN layer and the GaN layer is formed as a cap layer on the n-GaN layer, it is difficult to control the ion implantation through the cap layer sometimes.

A first aspect of the present invention is to provide a method of manufacturing a nitride semiconductor device comprising forming, on a substrate, a first laminated body where a first nitride semiconductor layer, a second nitride semiconductor layer and a third nitride semiconductor layer are laminated in this order; subsequent to the forming, removing a partial region of the third nitride semiconductor layer; subsequent to the removing, implanting ions to the first nitride semiconductor layer from the partial region where the third nitride semiconductor layer is removed at least through the second nitride semiconductor layer; and subsequent to the implanting the ions, annealing the first laminated body.

The first nitride semiconductor layer may be $Al_xGa_{1-x}N$ ($0 \le x < 0.5$). The second nitride semiconductor layer may be $Al_yGa_{1-y}N$ ($0.5 \le y \le 1$). The third nitride semiconductor layer is $Al_zGa_{1-z}N$ ($0 \le z < 0.5$).

The third nitride semiconductor layer may have a thickness no less than twice that of the second nitride semiconductor layer. A thickness of the first nitride semiconductor layer may be greater than the thickness of the third nitride semiconductor layer.

The second nitride semiconductor layer may have a thickness no less than 3 nm and no greater than 100 nm.

At the forming, the second nitride semiconductor layer is epitaxially formed on the first nitride semiconductor layer.

At the forming, the first nitride semiconductor layer, the second nitride semiconductor layer and the third nitride semiconductor layer may be continuously formed on a substrate by an epitaxial growth method.

At the removing, a partial region of the third nitride semiconductor layer may be removed until the second nitride semiconductor layer is exposed.

Prior to the annealing, forming the second nitride semiconductor layer and the third nitride semiconductor layer in this order under the substrate may be further comprised.

At the removing, the partial region of the third nitride semiconductor layer may be removed until the second nitride semiconductor layer is exposed, and another region of the third nitride semiconductor layer may be removed without exposing the second nitride semiconductor layer.

At the forming, one or more of second laminated bodies where the second nitride semiconductor layer and the third nitride semiconductor layer are laminated in this order may be further formed on the first laminated body.

At the removing, after the second laminated body on the partial region is all removed, a partial region of the third nitride semiconductor layer may be removed.

After the annealing, removing all of the second nitride semiconductor layer and the third nitride semiconductor layer which are in an active region may be further comprised.

It should be noted that the above-described invention summary clause does not necessarily describe all necessary features of the embodiments of the present invention. Also, the present invention may also be a sub-combination of the features described above.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

In the present specification, an X direction and a Y direction are directions perpendicular to each other, and a Z direction is a direction perpendicular to the X-Y plane. The X direction, the Y direction and the Z direction forms a so-called tight-handed system. It should be noted that in the present specification, the terms "on" and "above" mean "in a position in the +Z direction", and the terms "under" and "below" mean "in a position in the −Z direction". Also, a thickness of a layer or a film means a length in the Z direction. The Z direction is not necessarily a direction indicating a vertical direction perpendicular to the ground.

Figure 1:
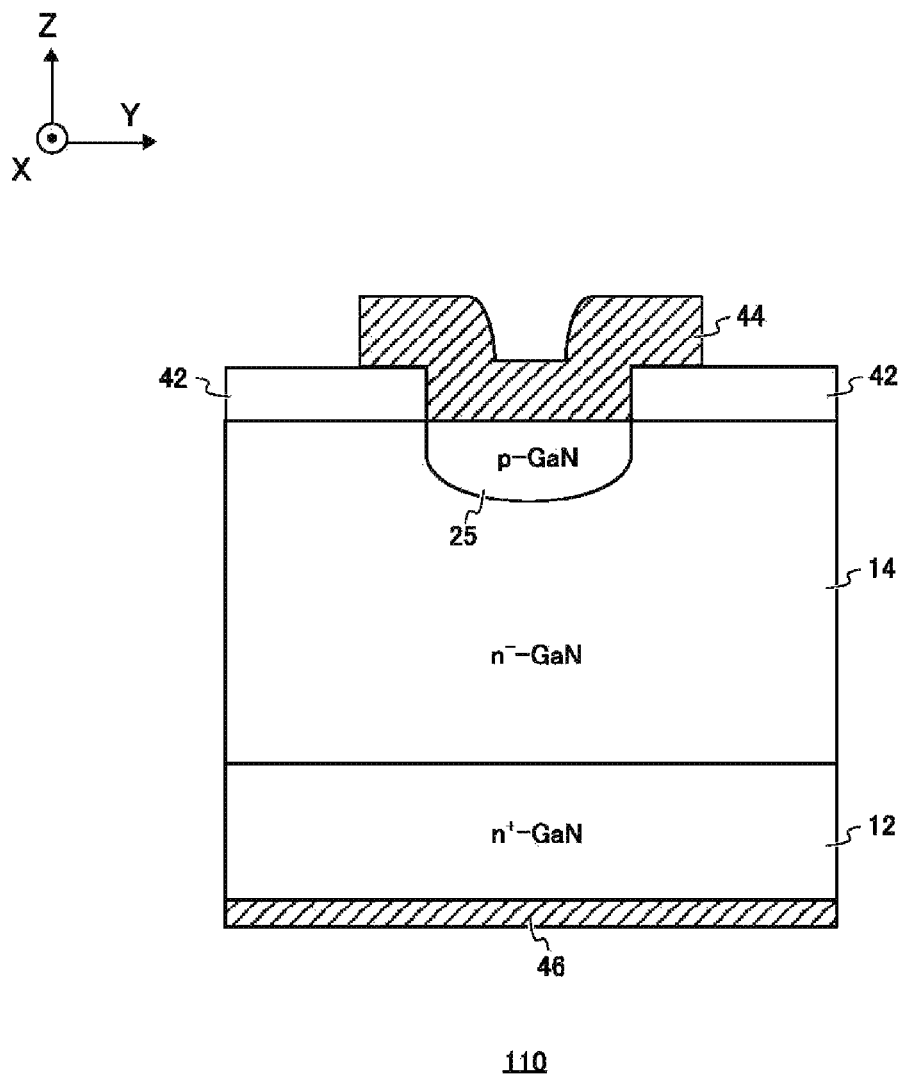
FIG. 1 shows a schematic view of a cross section of an active region 110 of a GaN diode 100 according to a first embodiment.

FIG. 1 is a schematic view showing a cross section of an active region 110 of a GaN diode 100 according to a first embodiment. The GaN diode 100 as a nitride semiconductor device has an n+-GaN substrate an n−-GaN layer 14, an insulation film 42, an anode electrode 44 and a cathode electrode 46.

The n−-GaN layer 14 has a p-GaN region 25 thereabove. The p-GaN region 25 and the n−-GaN layer 14 form a p-n junction. The GaN diode 100 has the anode electrode 44 on the p-GaN region 25 and has the cathode electrode 46 under the n+-GaN substrate 12.

Figure 2:
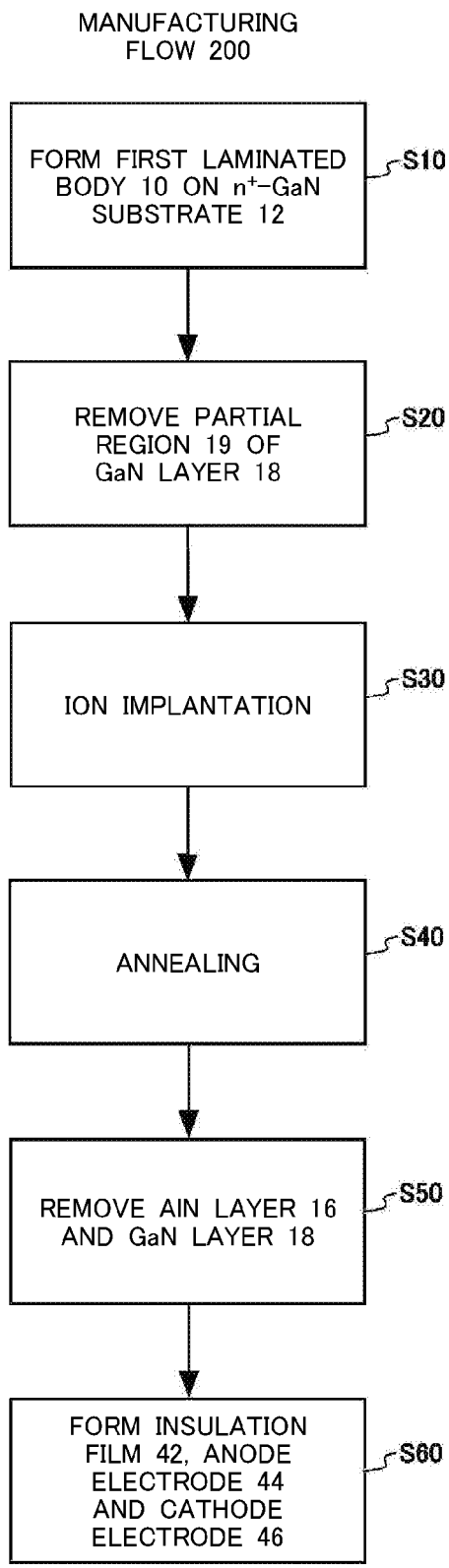
FIG. 2 shows a manufacturing flow 200 of the active region 110 according to the first embodiment.

FIG. 2 shows a manufacturing flow 200 of the active region 110 according to the first embodiment. In the present example, steps S10 to S60 are executed in this order. At the step S10 in the present example, the first laminated body 10, where the n−-GaN layer 14 as the first nitride semiconductor layer, the AlN layer 16 as the second nitride semiconductor layer and the GaN layer 18 as the third nitride semiconductor layer are laminated in this order, is formed on the n+-GaN substrate 12.

At a step S20, the partial region 19 of the GaN layer 18 is removed. At a step S30, the ion implantation of p type impurities is performed to the n−-GaN layer 14 from the partial region 19 where the GaN layer 18 is removed at least through the AlN layer 16. At a step S40, the first laminated body 10 is annealed to activate the ion-implanted p type impurities.

At a step S50, all of the AlN layer 16 and the GaN layer in the active region 110 are removed. Finally, at a step S60, the insulation film 42, the anode electrode 44 and the cathode electrode 46 are formed, and the active region 110 of the GaN diode 100 is completed.

Figure 3A:
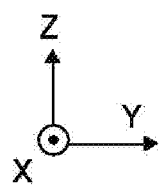
FIG. 3A shows a step (S10) of forming a laminated body 10 on an $n^+$-GaN substrate 12.
Figure 3A:
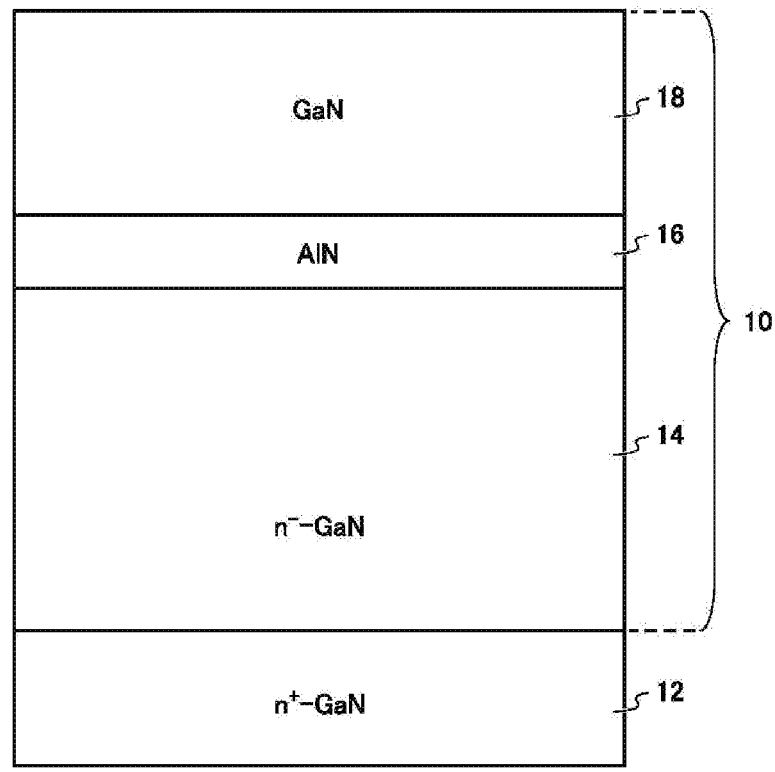

FIG. 3A shows a step (S10) of forming the laminated body 10 on the n+-GaN substrate 12. It should be noted that although the n+-GaN substrate 12 is used in the present example, in a case of applying the manufacturing flow 200 to a planar MOSFET, a sapphire substrate may be used instead of the n+GaN substrate 12. First, the reason why the n−-GaN layer 14, the AlN layer 16 and the GaN layer 18 are laminated and formed in this order will be described.

When the AlN layer 16 is provided as a cap layer of the n−-GaN layer 14, the AlN layer 16 is formed by sputtering in some cases. However, the AlN layer 16 formed by sputtering is coarse compared to the AlN layer 16 formed by an epitaxial growth method. Therefore, the effect of preventing N (nitrogen) from coming out the GaN layer during the annealing is not sufficient. Therefore, it is assumed that the AlN layer 16 is formed by the epitaxial growth method during the annealing of the n−-GaN layer 14.

The AlN layer 16 epitaxially formed on the n−-GaN layer 14 is fine compared to the AlN layer formed by sputtering. However, if only the AlN layer 16 is epitaxially formed on the n−-GaN layer 14, a crack occurs in the AlN layer 16 due to a difference in lattice constants between GaN and AlN. The thicker the AlN layer 16, the more the crack is likely to occur. Therefore, an AlN layer 16 having enough thickness to exhibit sufficient effect as a cap layer cannot be formed.

Here, it is assumed that the AlN layer 16 is sandwiched between the upper side and lower side of GaN by further providing a GaN layer 18 on the AlN layer 16. Accordingly, since the occurrence of the crack in the AlN layer 16 can be prevented, the AlN layer 16 can be set to have a thickness which sufficiently exhibits an effect as a cap layer. Therefore, it is preferable to use a lamination of the AlN layer 16 and the GaN layer 18 as a cap layer. Therefore, the laminated body 10 is formed in the present example.

The n−-GaN layer 14 as the first nitride semiconductor layer may be $Al_xGa_{1-x}N$ (0≤x<0.5). Also, the AlN layer 16 as the second nitride semiconductor layer may be $Al_yGa_{1-y}N$ (0.5≤y≤1), and the GaN layer 18 as the third nitride semiconductor layer may be the $Al_zGa_{1-z}N$ (0≤z<0.5). It should be noted that when taking the preventing effect on the occurrence of the crack into consideration, it is desired that the composition of the first nitride semiconductor layer and the composition of the third nitride semiconductor layer are either the same (x is equal to z) or close ones (x is nearly equal to z).

The AlN layer 16 has a thickness no less than 3 nm and no greater than 100 nm. A thickness of 3 nm is a critical film thickness at which a dislocation begins to occur in the AlN layer 16. A thickness of 100 nm is an upper limit of film thickness at which ions to be implanted in a sequent process can be permeated. Therefore, the thickness of the AlN layer 16 is set as no less than 3 nm and no greater than 100 nm.

In the present example, the AlN layer 16 is epitaxially formed on the n−-GaN layer 14 by MOCVD. It should be noted that in order to epitaxially form the AlN layer 16, Halide Vapor Phase Epitaxy (HVPE) or Molecular Beam Epitaxy (MBE) may be used. Since the AlN layer 16 is epitaxially formed, the AlN layer 16 can be made fine compared to a film formed by sputtering. Accordingly, in a sequent annealing, the preventing effect on the coming-off of N of the n−-GaN layer 14 is improved. The GaN layer 18 has a thickness no less than twice that of the AlN layer 16. The GaN layer 18 in the present example has a thickness of 30 nm to 500 nm. The thickness of the n−-GaN layer 14 is greater than the thickness of the GaN layer 18. The n−-GaN layer 14 in the present example has a thickness no less than 2 μm. Therefore, the thickness of the AlN layer 16 can be set sufficiently thick, such that the crack in the AlN layer 16 can be prevented and the coming-off of N of the n⁻-GaN layer 14 can be prevented.

In the present example, the n⁻-GaN layer 14, the AlN layer 16 and the GaN layer 18 are continuously formed on the n⁺-GaN substrate 12 by an epitaxial growth method. In the present specification, the epitaxial growth method indicates a layer formation by MOCVD, HVPE and MBE described above. The term "continuously form" indicates that layers with different compositions are formed sequentially by changing gas types in accordance with time while placing the n⁺-GaN substrate 12 on the same chamber. By continuously forming, it can prevent a contamination of an interface between the n⁻-GaN layer 14 and the AlN layer 16.

Specifically, a mixed gas including $NH_3$ (ammonia) gas and at least one of TMA (Trimethylaluminium) gas and TMGa (Trimethylgalium) gas is introduced into a chamber. The n⁻-GaN layer 14, the AlN layer 16 and the GaN layer 18 are formed sequentially under a condition where a temperature is set at 800° C. to 1200° C. and an atmosphere pressure is set at 5 k Pa to 20 k Pa. For forming the n⁻-GaN, gas including, for example, Si (silicon), Ge (germanium), S (sulfur) or O (oxygen) is introduced. For example, using $SiH_4$, the n⁻-GaN where Si is impurity doped is formed.

In the present example, the n⁻-GaN layer 14 as the first nitride semiconductor layer, the AlN layer 16 as the second nitride semiconductor layer and the GaN layer 18 as the third nitride semiconductor layer are respectively used. However, the compositions of $Al_xGa_{1-x}N(0\leq x<0.5)$, $Al_yGa_{1-y}N$ $(0.5\leq y\leq 1)$ and $Al_zGa_{1-z}N(0\leq z<0.5)$ can be appropriately adjusted by appropriately adjusting flow rates of TMA, TMGa and $NH_3$.

Figure 3B:
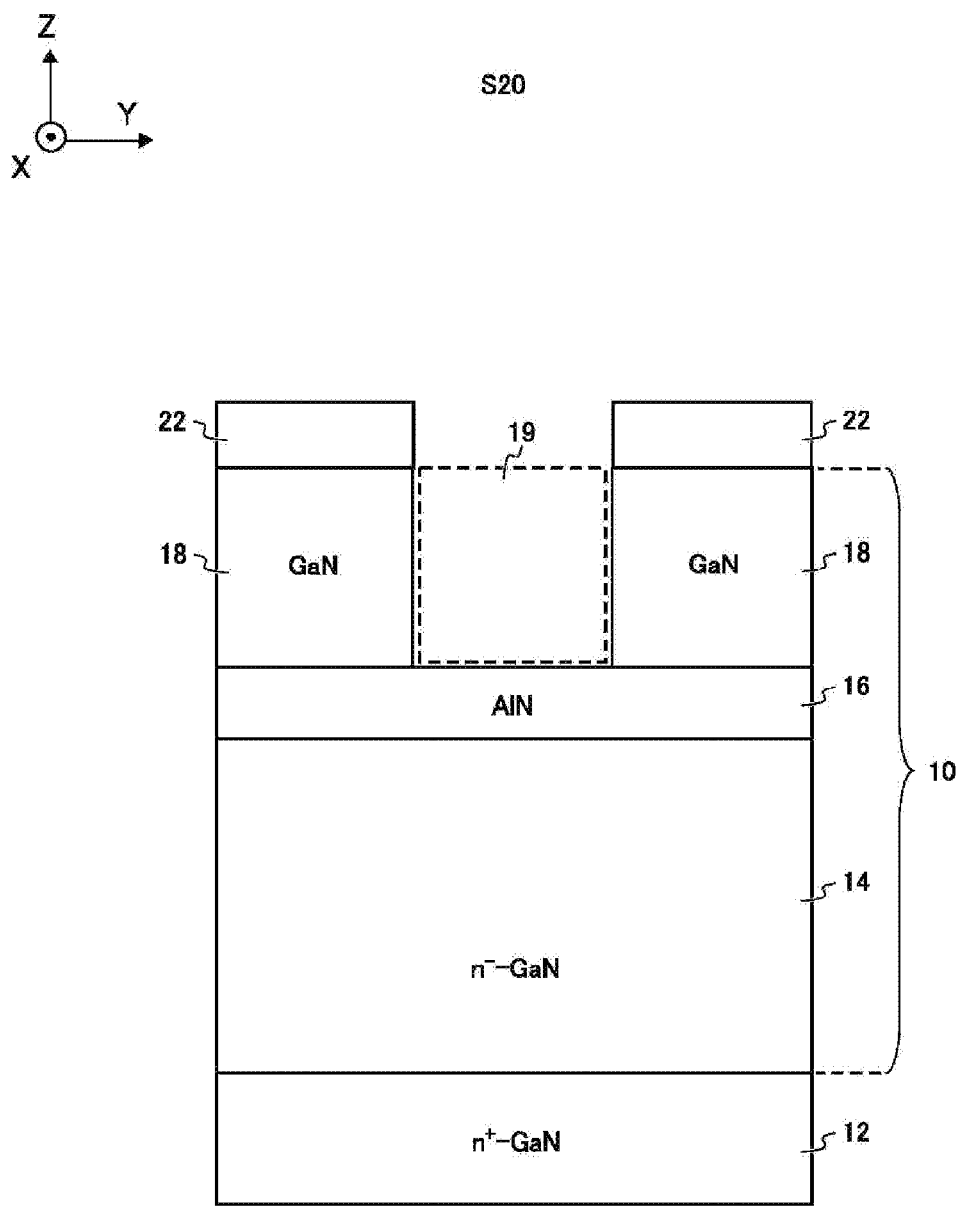
FIG. 3B shows a step (S20) of removing a partial region 19 of a GaN layer 18.

FIG. 3B shows the step (S20) of removing the partial region 19 of the GaN layer 18. First, the reason why the partial region 19 of the GaN layer 18 is removed will be described. When performing ion implantation of p type impurities to the n⁻-GaN layer 14 to form an impurities region, an annealing using a cap layer is required. Here, after performing the ion implantation of the p type impurities to the n⁻-GaN layer 14, since a surface of the n⁻-GaN layer 14 is roughened, an epitaxial growth of the AlN layer 16 cannot be obtained on the n⁻-GaN layer. Also, when laminating the AlN layer 16 and the GaN layer 18 to form a cap layer, it is difficult to control the ion implantation by penetrating the cap layer in some cases.

Here, in the present example, in a portion corresponding to the ion implantation region of the n⁻-GaN layer 14, the partial region 19 of the GaN layer 18 is removed until the AlN layer 16 is exposed. In the present example, first, an opening is formed on the region 19 by patterning a photoresist film 22 by a known etching method. After that, the region 19 of the GaN layer 18 is etched using the photoresist film 22 as an etching mask. Chlorine-based gas (for example, $Cl_2$, $BCl_3$, $SiCl_4$, $CHCl_3$ and the like) can be used to etch the GaN layer 18. Since the AlN layer 16 cannot be etched by the gas etching the GaN layer 18, the AlN layer 16 functions as an etching stop layer for the n⁻-GaN layer 14. It should be noted that in the partial region 19, the GaN layer 18 may not be completely removed and the GaN layer 18 may be left with some thickness in the Z direction.

Figure 3C:
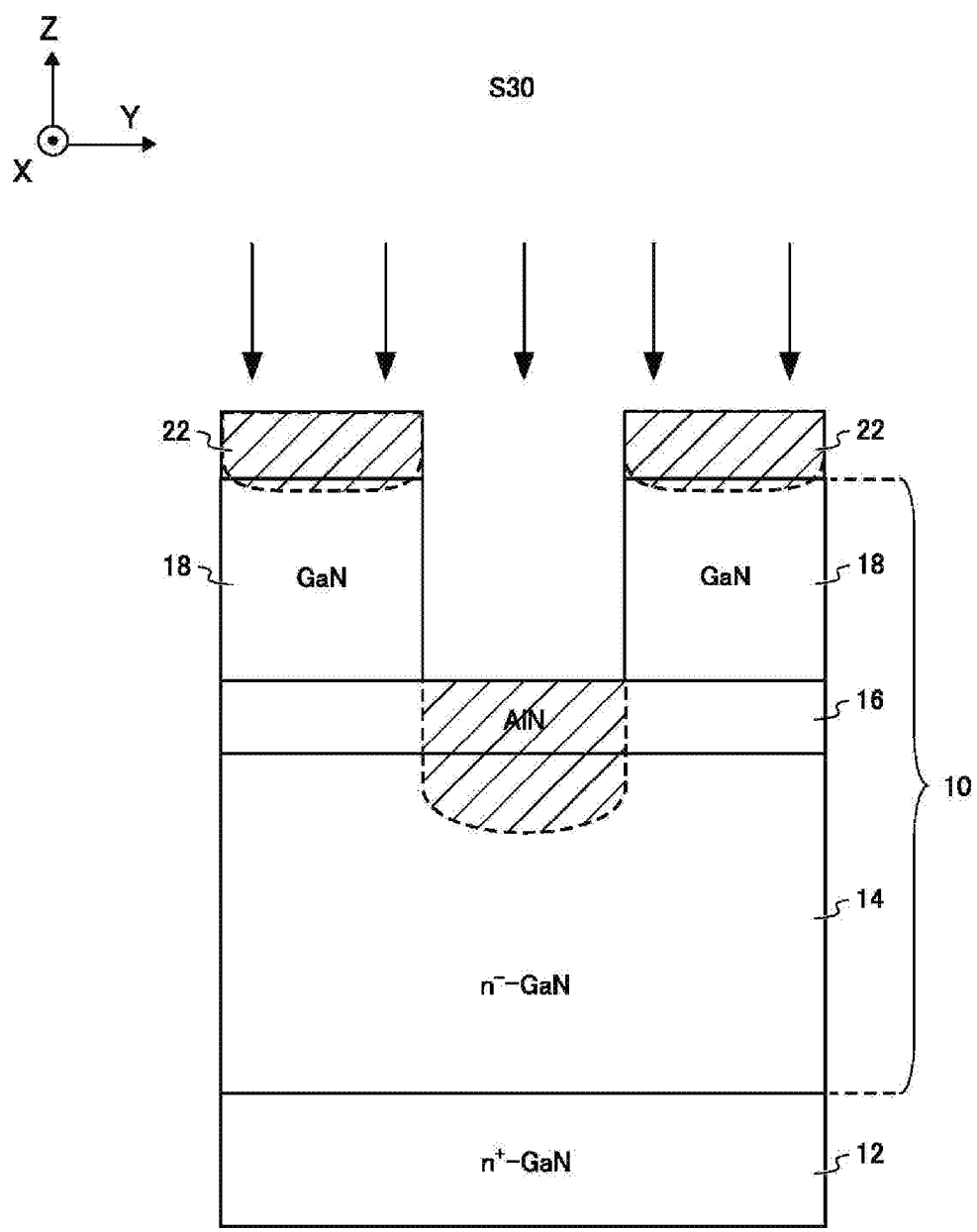
FIG. 3C shows a step (S30) of implanting ions.

FIG. 3C shows the step (S30) of implanting ions. Regions represented by oblique lines show regions where the implanted ions are present. In the present example, Mg ions are implanted at 100 keV and $1\times 10^{13}$ $cm^{-2}$. The Mg ions penetrate the AlN layer 16 and reaches the n⁻-GaN layer 14.

The photoresist film 22 and the GaN layer 18 prevent the Mg ions from reaching the n⁻-GaN layer 14. Also, since the ion implantation region can be prescribed in accordance with the removal region of the GaN layer 18, the controllability of the ion implantation is improved. In addition, it is not required to form a mask for the ion implantation separately from the cap layer. Also, since the AlN layer 16 and the GaN layer 18 are formed before the ion implantation, a cap layer regrowth on the roughened surface after the ion implantation is not necessary.

Figure 3D:
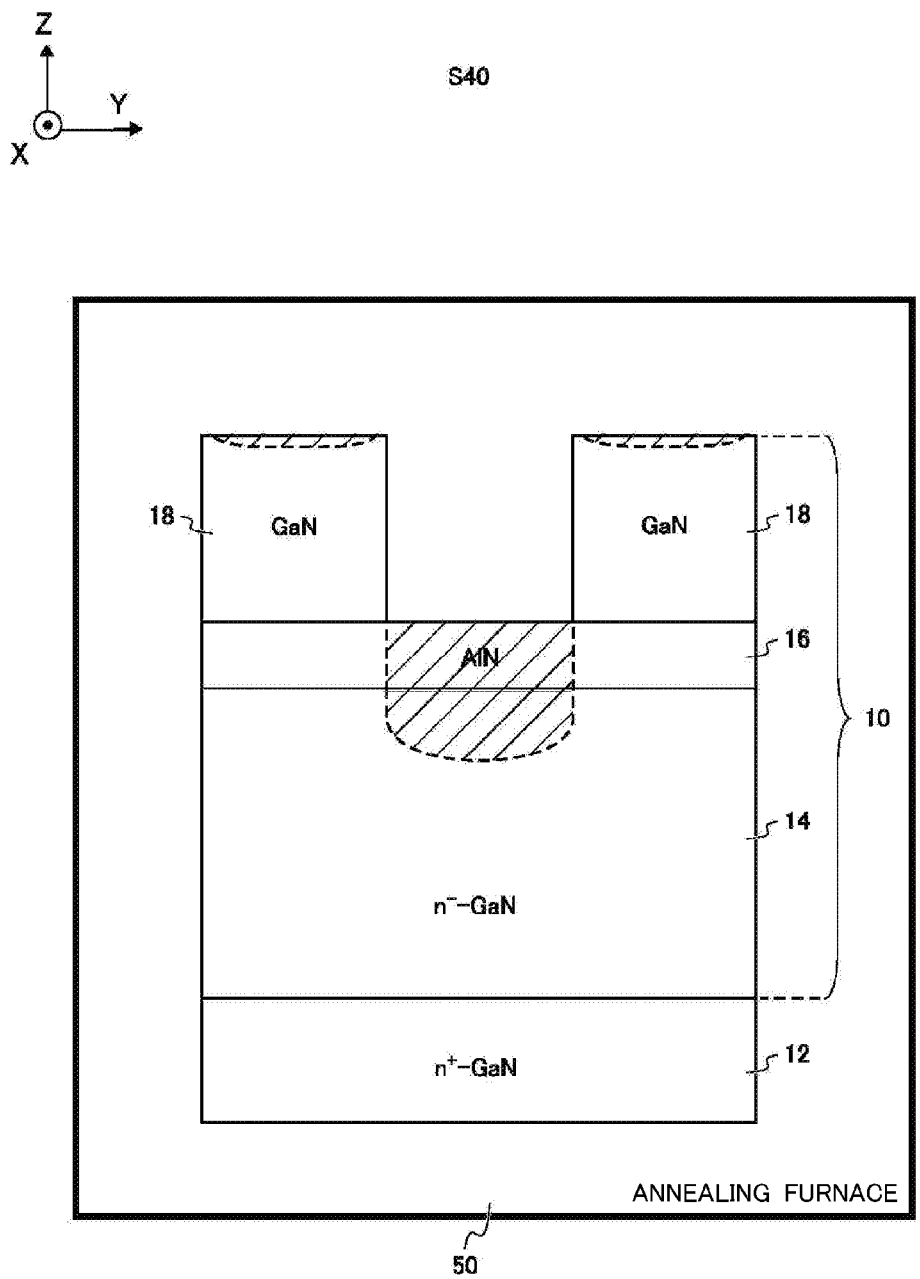
FIG. 3D shows a step (S40) of annealing.

FIG. 3D shows the step (S40) of annealing. After an etching removal of the photoresist film 22, the n⁺-GaN substrate 12 and the laminated body 10 are annealed in an annealing furnace 50. It is preferable to set the temperature for the annealing with a lower limit no less than 800° C., more preferably no less than 1200° C., further preferably no less than 1500° C., and with an upper limit of 2000C. It is desired to set the atmosphere pressure at 0.1 M Pa to 1000 M Pa. $N_2$ (nitrogen) or $NH_3$ may be used as the atmosphere gas. It should be noted that a new AlN film may be formed using the sputtering method and the like in the surfaces in the +Z direction of the AlN layer 16 and the GaN layer 18 before the annealing.

Figure 3E:
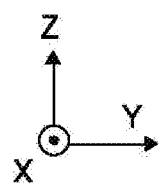
FIG. 3E shows a step (S50) of removing an AlN layer 16 and the GaN layer 18.
Figure 3E:
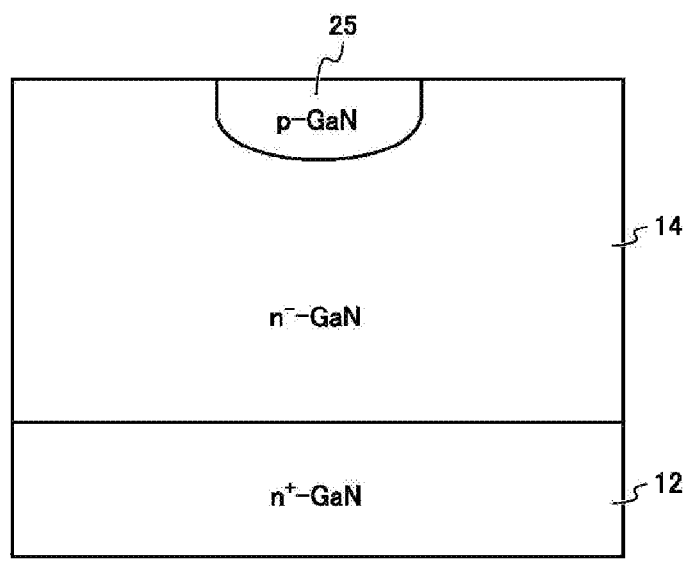

FIG. 3E shows the step (S50) of removing the AlN layer 16 and the GaN layer 18, Since the p-GaN region 25 has been formed at the step (S40) of the prior annealing, the AlN layer 16 and the GaN layer 18 are removed next. For example, the etching removal of the GaN layer 18 is performed by the above-described chlorine-based gas, and the etching removal of the AlN layer 16 is performed by KOHaq (a potassium hydroxide aqueous solution). Although KOHaq etches the AlN layer 16, it hardly etches the GaN layer 18.

Figure 3F:
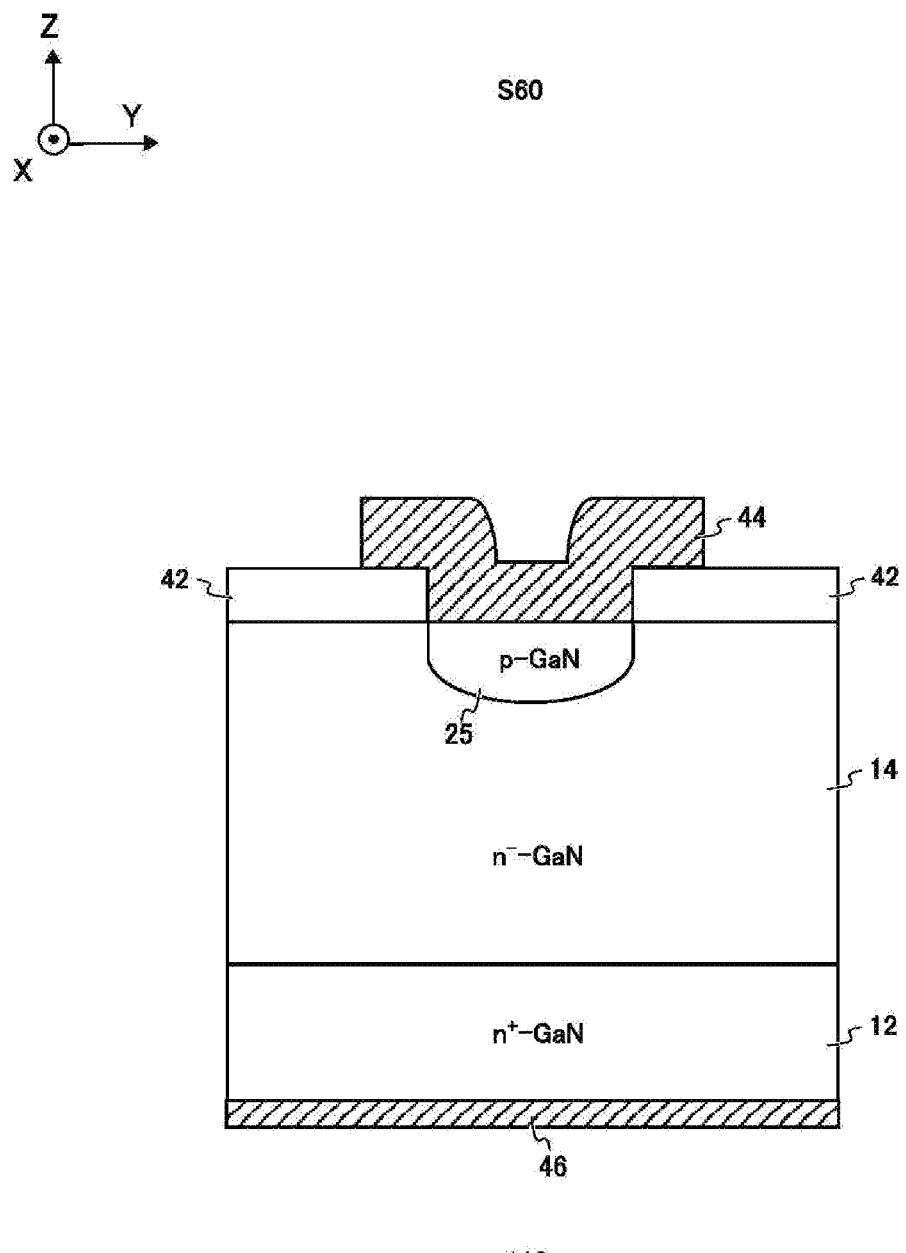
FIG. 3F shows a step (S60) of forming an insulation film 42, an anode electrode 44 and a cathode electrode 46.

FIG. 3F shows the step (S60) of forming the insulation film 42, the anode electrode 44 and the cathode electrode 46. The insulation film 42 is formed by patterning. The insulation film 42 may be a silicon oxide formed by CVD. After that, the anode electrode 44 is formed on the p-GaN region 25. The anode electrode 44 may be any one of Ni (nickel), Pt (platinum), Pd (palladium) and Au (gold), or a laminated film thereof. The cathode electrode 46 may be a laminated film of Ti (titanium) and Al (aluminum), or a laminated film of Ti, Al, Ni and Au.

Figure 4:
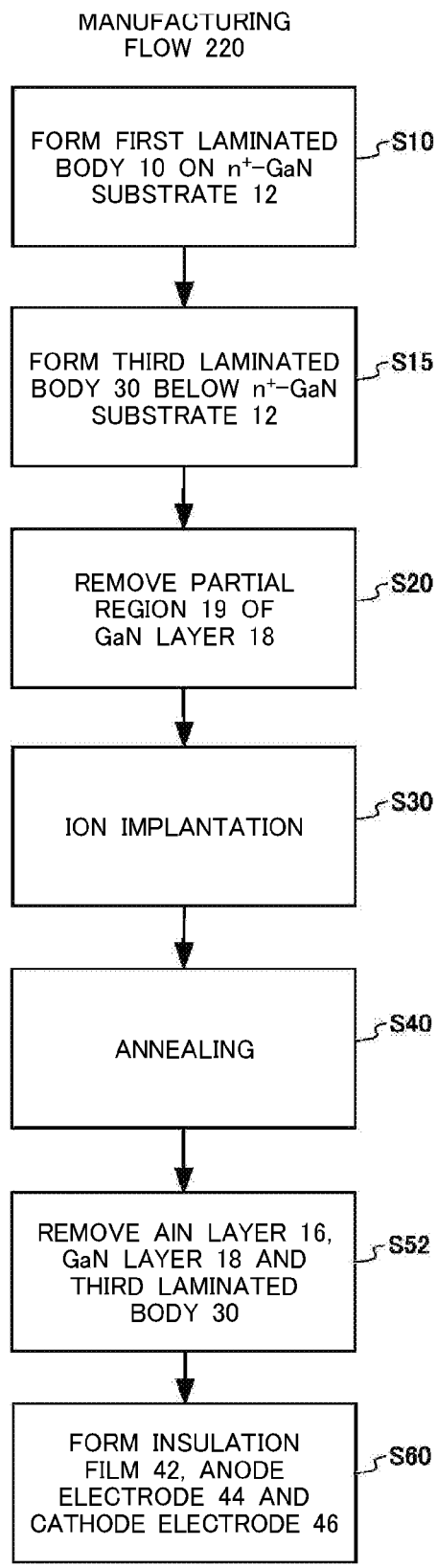
FIG. 4 shows a manufacturing flow 220 of an active region 110 according to a second embodiment.

FIG. 4 shows a manufacturing flow 220 of an active region 110 according to a second embodiment. In the present example, between the step (S10) and the step (S20), the present example further comprises a step (S15) of forming a third laminated body 30 under the n⁺-GaN substrate 12. Also, instead of the step (S50) in the first embodiment, the present example comprises a step (S52) of removing the first laminated body 10 and the third laminated body 30. It is different from the first embodiment in this point. It is common with the first embodiment in the other points.

Figure 5:
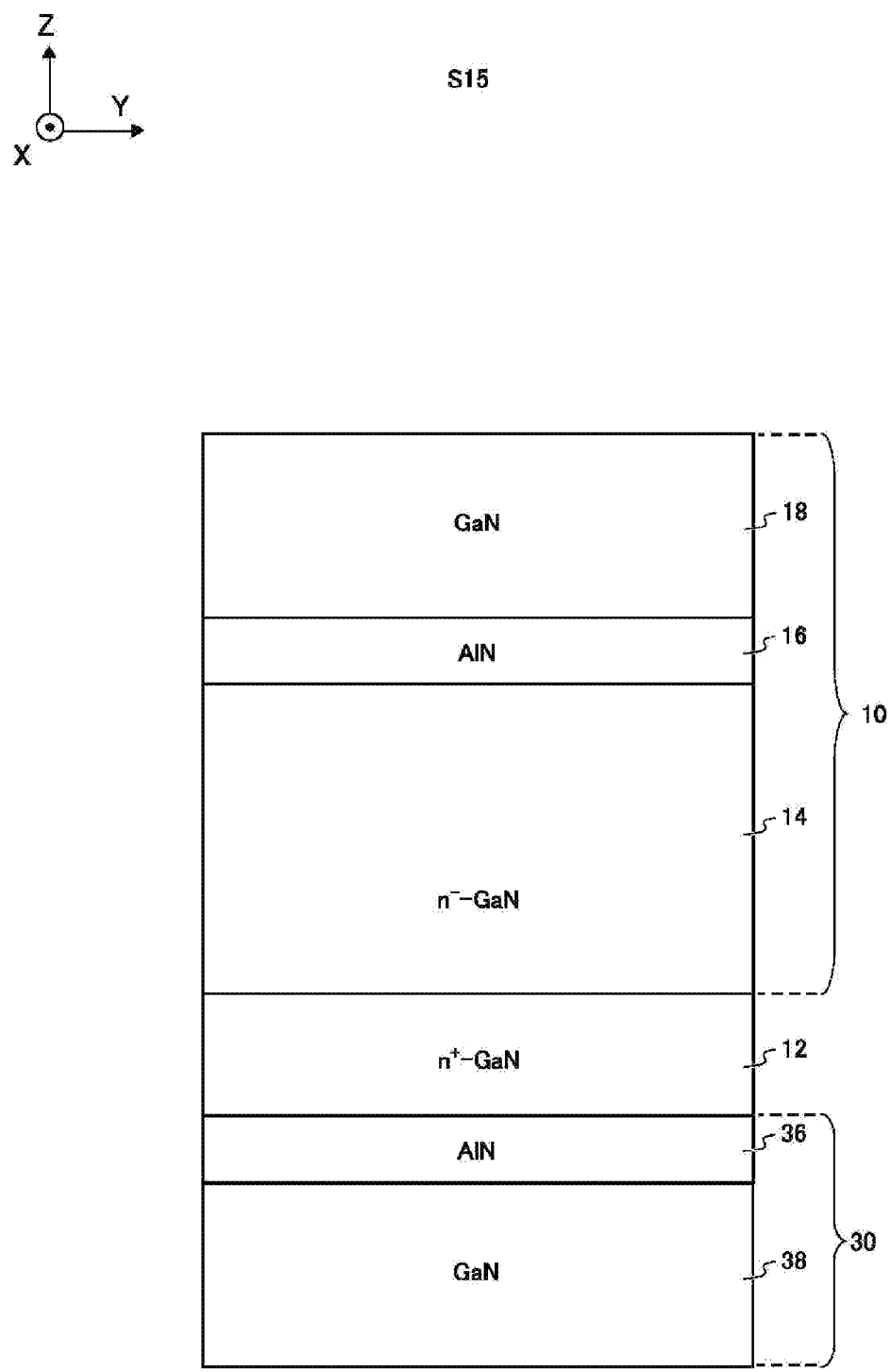
FIG. 5 shows a step (S15) of forming a laminated body 30 under the $n^+$-GaN substrate 12.

FIG. 5 shows the step (S15) of forming the laminated body 30 under the n⁺-GaN substrate 12. At the step (S15), the third laminated body 30, where an AlN layer 36 and a GaN layer 38 are formed in this order under the n⁺-GaN substrate 12, is formed. Accordingly, after the step (S40) of annealing, it can prevent the coming-off of N from the surface in −Z direction (that is, the back surface) of the n⁺-GaN substrate 12. Accordingly, for example, when forming a vertical type MOSFET according to the manufacturing flow 220, the back surface of the n⁺-GaN substrate 12 being a drain electrode can be obtained to be a surface with less surface roughness and less interface state density.

Figure 6:
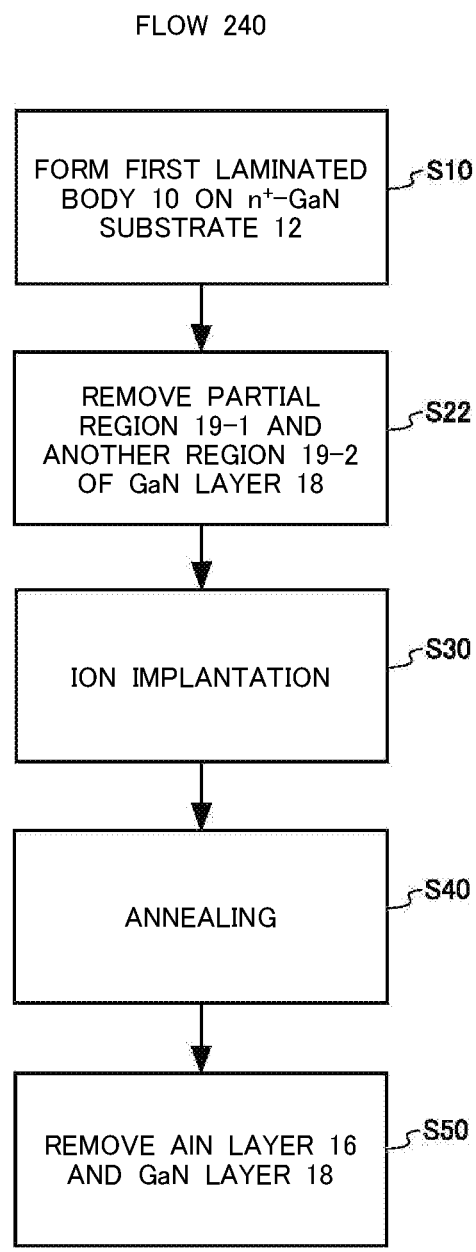
FIG. 6 shows a forming flow 240 of a p type impurities region according to a first modified example.

FIG. 6 shows a forming flow 240 of a p type impurities region according to a first modification example. In the present example, instead of the step (S20) in the first embodiment, at a step (S22), a partial region 19-1 of the GaN layer 18 is completely removed, and another region 19-2 of the GaN layer 18 is partially removed. it is different from the first embodiment in this point.

Figure 7A:
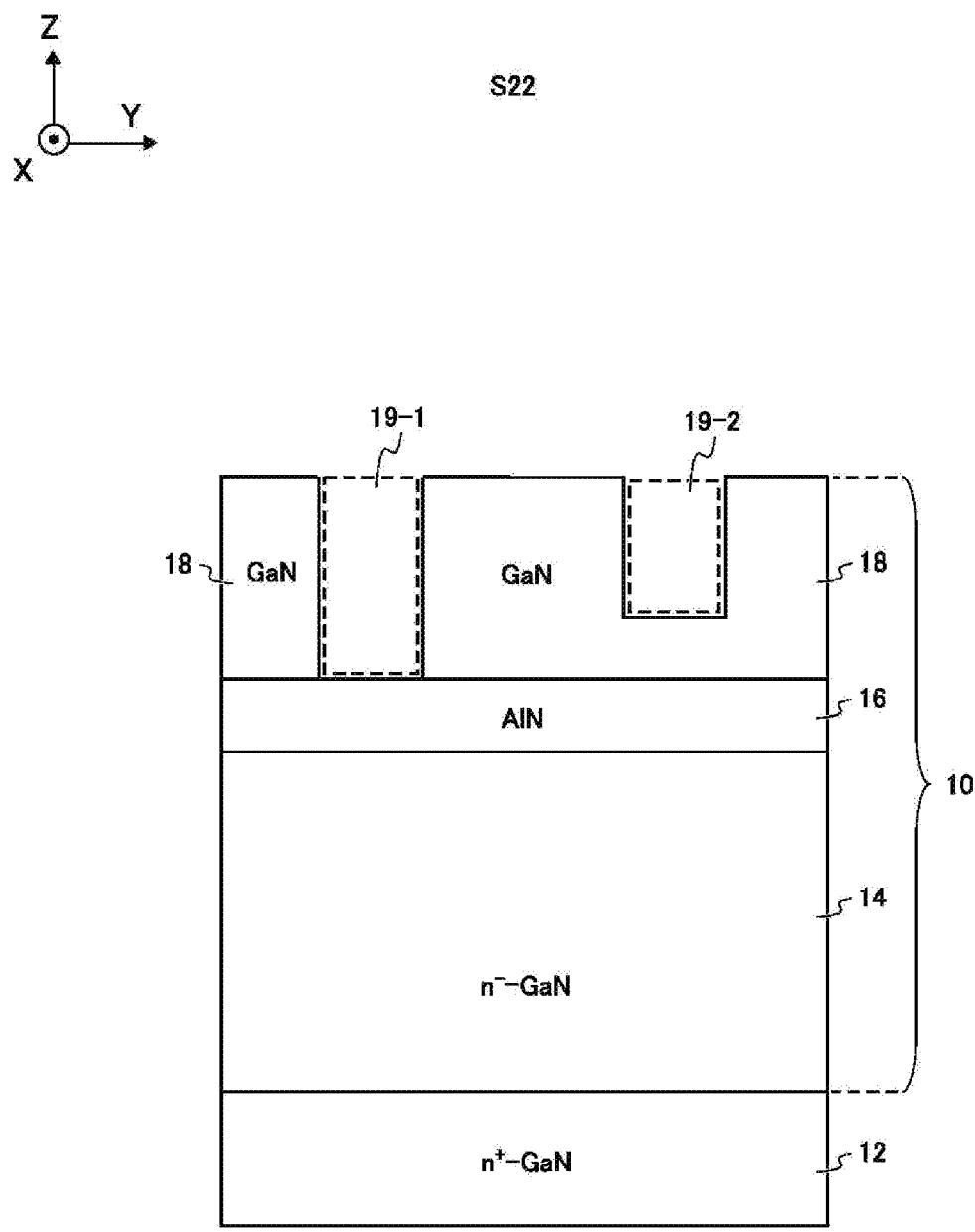
FIG. 7A shows a step (S22) of removing a partial region 19-1 and another region 19-2 of the GaN layer 18.

FIG. 7A shows the step (S22) of removing the partial region 19-1 and the other region 19-2 of the GaN layer 18. At the step (S22), the partial region 19-1 of the GaN layer 18 is removed until the AlN layer 16 is exposed. On the other hand, in the other region 19-2, the GaN layer 18 is removed such that the AlN layer 16 is not exposed. In the present example, a state shown in FIG. 7A is achieved by applying a photolithographic process twice.

Figure 7B:
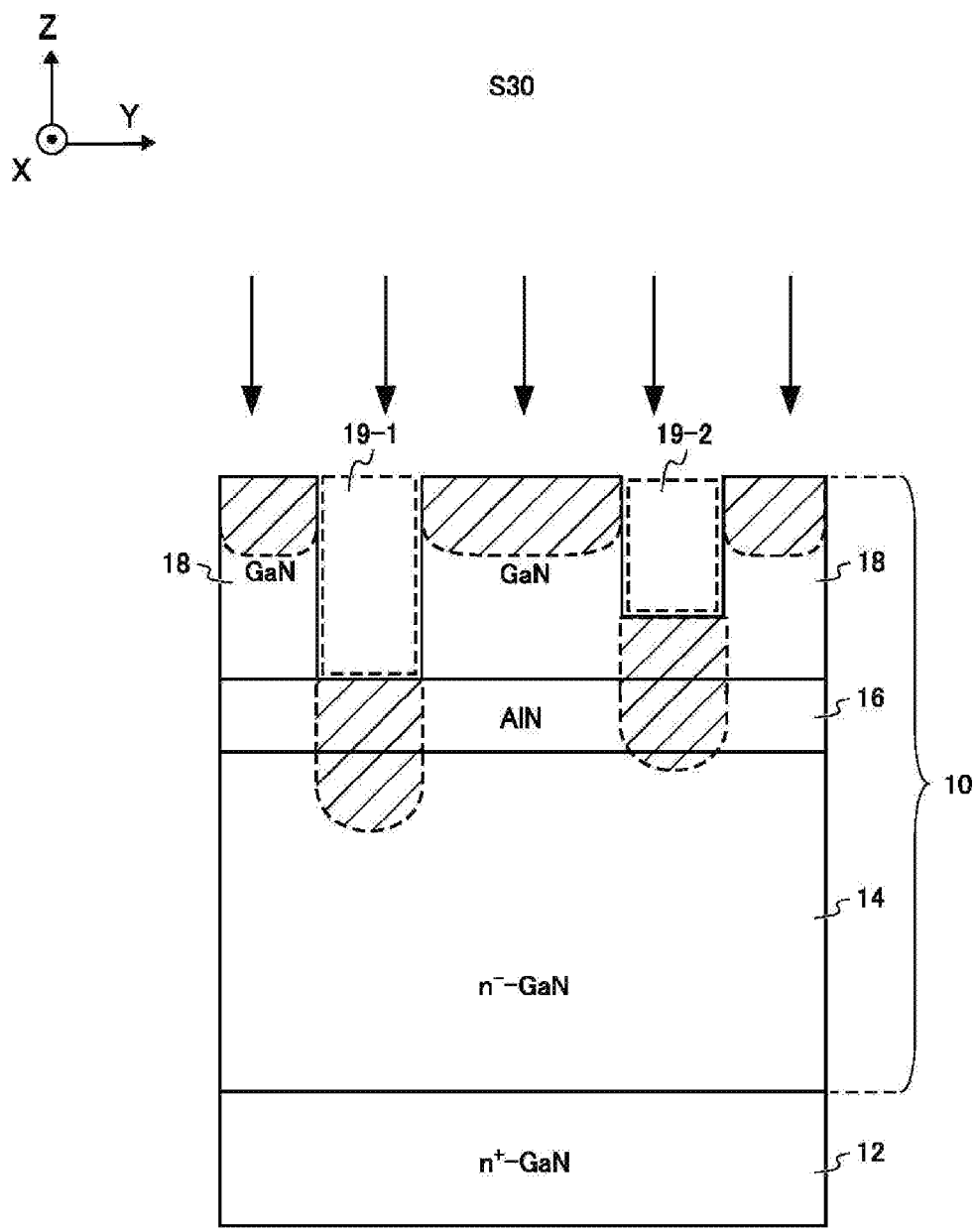
FIG. 7B shows a step (S30) of implanting ions.

FIG. 7B shows the step (S30) of implanting ions. In the region 19-1 in the present example, the ions are implanted through the AlN layer 16 only. On the other hand, in the region 19-2, the ions are implanted through the half-etched GaN layer 18 in addition to the AlN layer 16. Accordingly, an implantation depth of the portion where the ions are implanted only through the AlN layer 16 can be set greater than an implantation depth of the portion where the ions are implanted through the AlN layer 16 and the GaN layer 18.

Figure 7C:
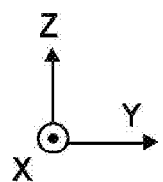
FIG. 7C shows a step (S50) of removing the AlN layer 16 and the GaN layer 18.
Figure 7C:
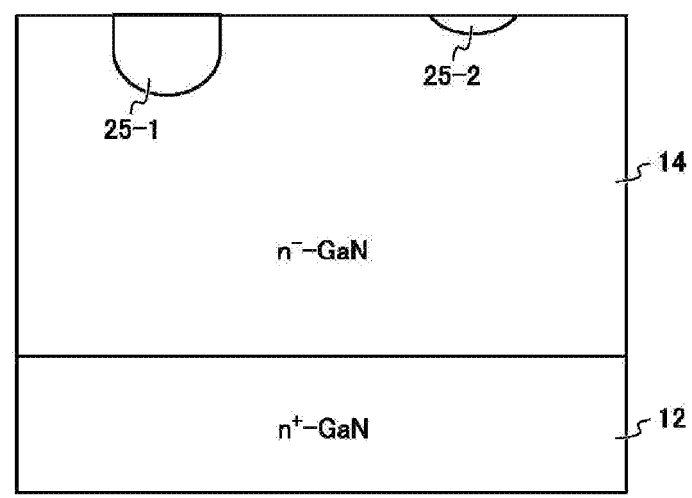

FIG. 7C shows the step (S50) of removing the AlN layer 16 and the GaN layer 18. Reflecting the thickness of the GaN layer 18, the implantation depth of the p-GaN region 25-1 is greater than the implantation depth of the p-GaN region 25-2. In this way, in accordance with the thickness of the GaN layer 18, it can control the depth of the p type impurities region.

Figure 8:
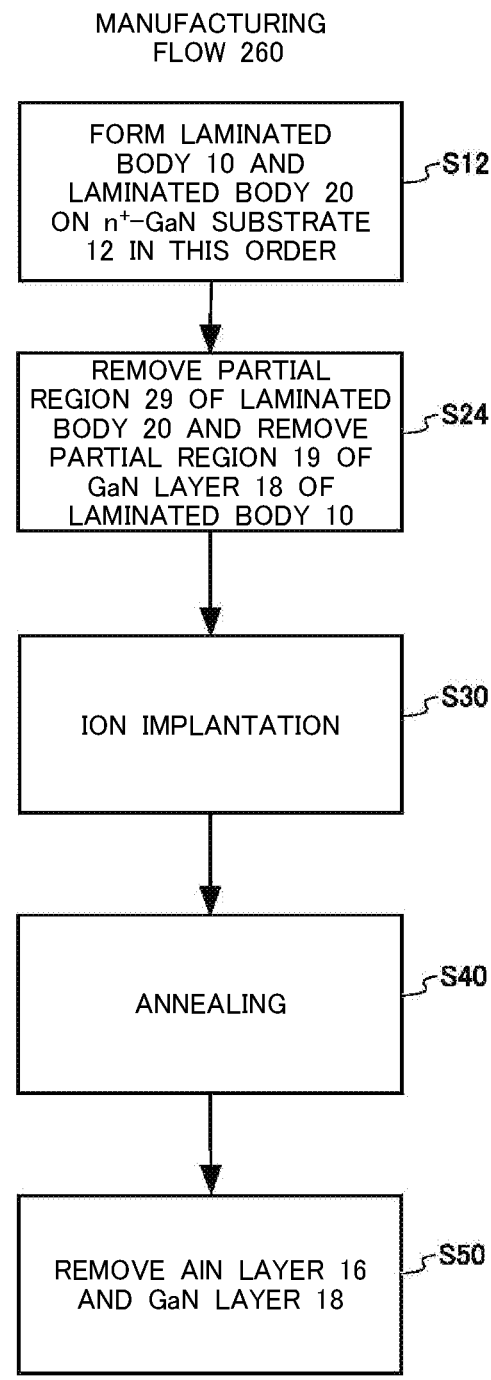
FIG. 8 shows a manufacturing flow 260 of an active region 110 according to a third embodiment.

FIG. 8 shows a manufacturing flow 260 of an active region 110 according to a third embodiment. In the present example, at a step (S12), one or more of second laminated bodies 20 are further formed on a first laminated body 10. In the present example, although one second laminated body 20 is formed, two or more than two second laminated bodies 20 may be formed. Also, at a step (S24), after a partial region 29 of the second laminated body 20 on the partial region 19 is completely removed, the partial region 19 of the GaN layer 18 under the laminated body 20 is removed.

Figure 9A:
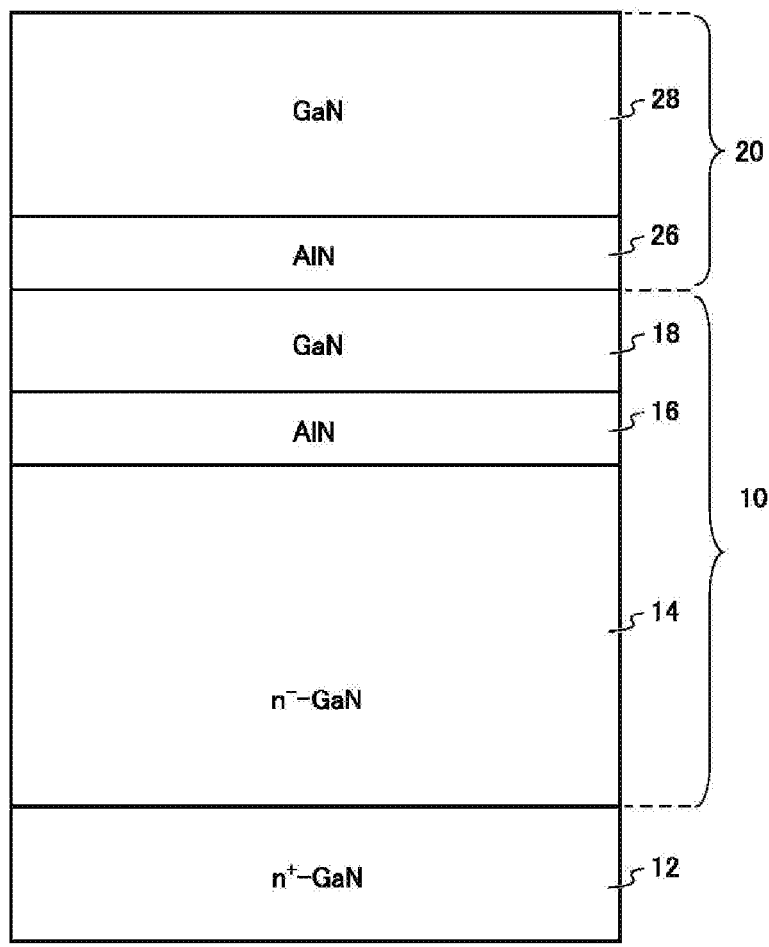
FIG. 9A shows a step (S12) of forming the laminated body 10 and a laminated body 20 in this order on the n+-GaN substrate 12.

FIG. 9A shows the step (S12) of forming the laminated body 10 and the laminated body 20 in this order on the n$^+$GaN substrate 12. In the second laminated body 20, an AlN layer 26 and a GaN layer 28 are laminated in this order. In the present example, the first laminated body 10 and the second laminated body 20 are continuously formed by an epitaxial growth method. The AlN layer 16 and the AlN layer 26 may be set to have the same composition, and the GaN layer 18 and the GaN layer 28 may also be set with the same composition.

Figure 9B:
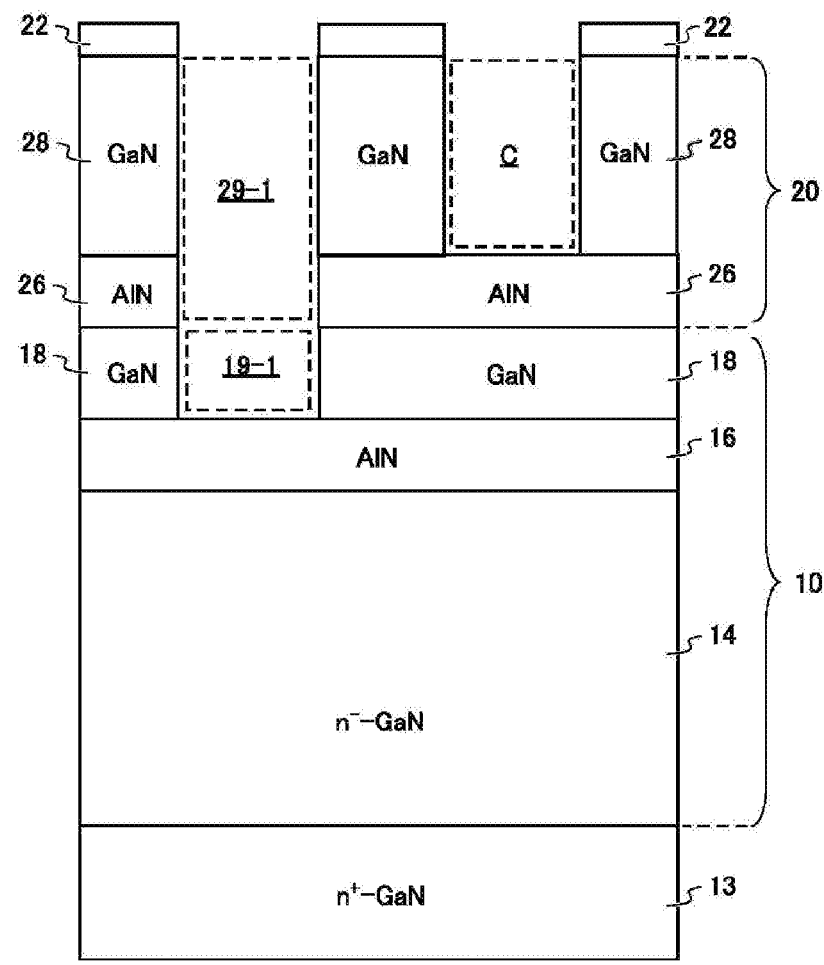
FIG. 9B shows a step (S14) of removing a partial region 29 of the laminated body 20, and removing the partial region 19 of the laminated body 10.

FIG. 9B shows a step (S14) of removing the partial region 29 of the laminated body 20, and removing the partial region 19 of the laminated body 10. In the present example, the GaN layer 18 and the GaN layer 28 are dry-etched by chlorine-based gas, and the AlN layer 26 is wet-etched by KOHaq. After patterning the photoresist film 22, the region 19-1 of the GaN layer 18 in the first laminated body 10 and a region C of the GaN layer 28 in the second laminated body 20 are dry-etched at the same timing.

Figure 9C:
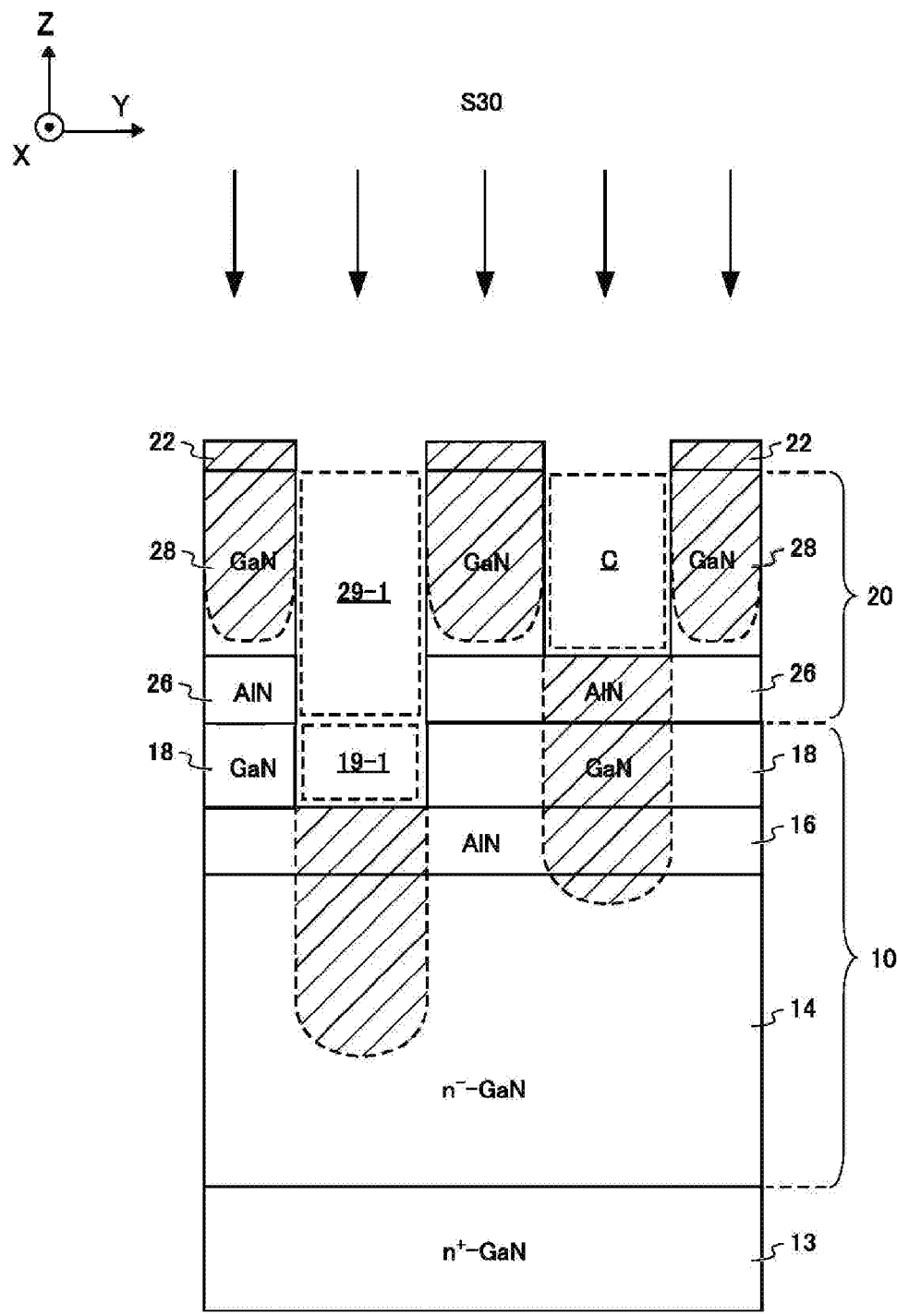
FIG. 9C shows a step (S30) of implanting ions.

FIG. 9C shows the step (S30) of implanting ions. In the n$^-$-GaN layer 14 under the region 19-1, p type impurities are deeply doped. On the other hand, in the n$^-$-GaN layer 14 under the region C. the p type impurities are shallowly doped. In this way, the regions with different implantation depths of the impurities can be selectively formed in accordance with whether where the AlN layer is exposed is the laminated body 10 or the laminated body 20.

Figure 10:
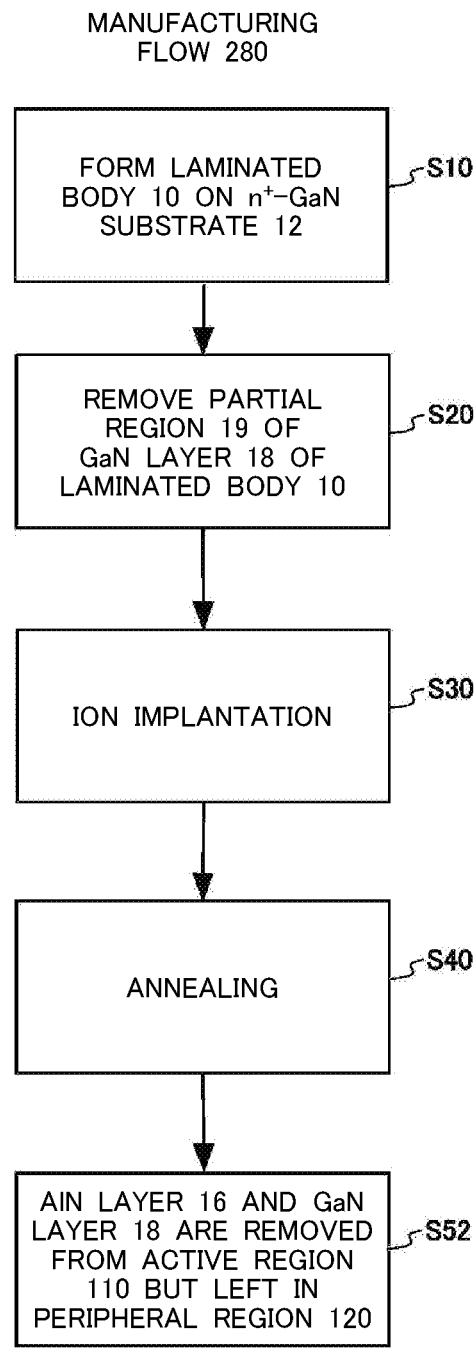
FIG. 10 shows a manufacturing flow 280 of an active region 110 according to a forth embodiment.

FIG. 10 shows a manufacturing flow 280 of the active region 110 according to a forth embodiment. In the present example, at the step of removing the AlN layer 16 and the GaN layer 18, both layers are removed from the active region 110, but none of them are removed from a peripheral region 120. Accordingly, the AlN layer 16 and the GaN layer 18 in the peripheral region 120 can be used as a surface protection film (a passivation film).

Figure 11:
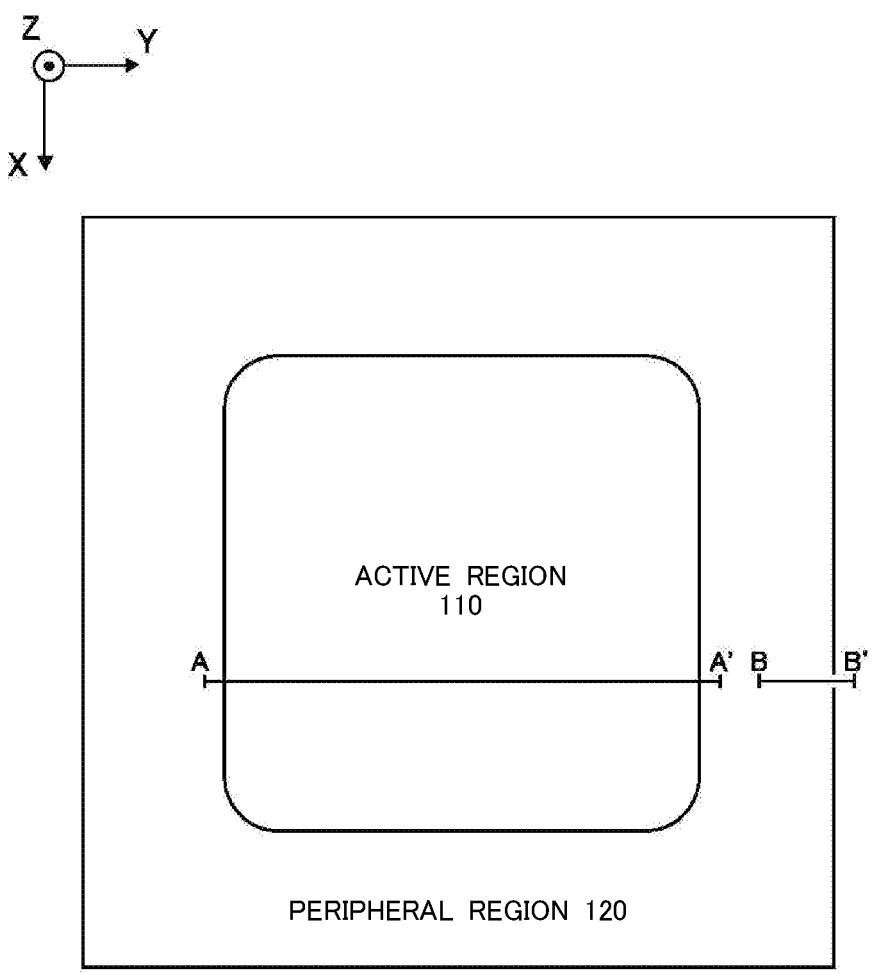
FIG. 11 schematically shows a top view of the GaN diode 100.
Figure 12:
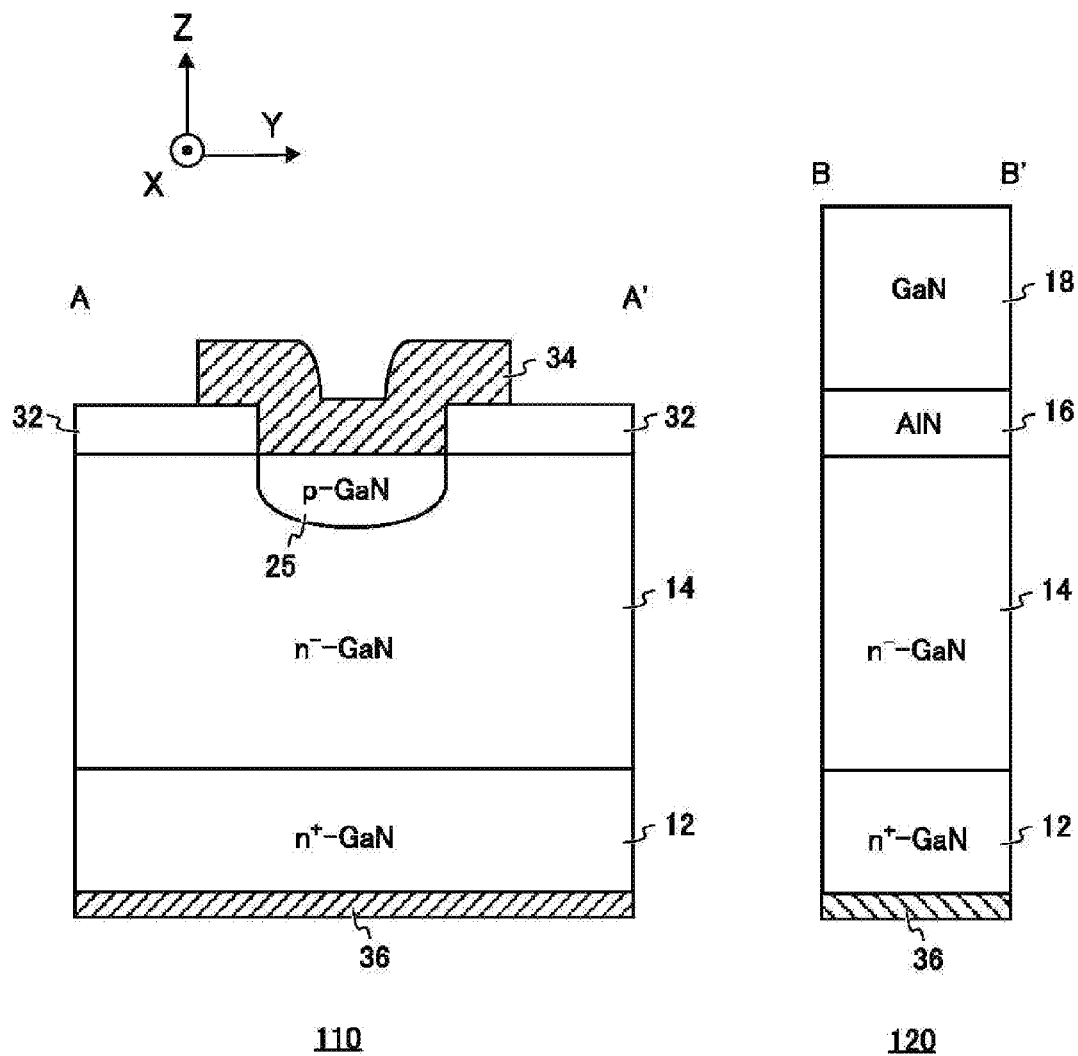
FIG. 12 shows a schematic view of a cross section of the active region 110 and a peripheral region 120.

FIG. 11 schematically shows a top view of the GaN diode 100. The peripheral region 120 is provided around the active region 110. FIG. 12 is a schematic view showing a cross section of the active region 110 and the peripheral region 120. The left side of FIG. 12 is an A-A' section in FIG. 11 and shows the active region 110. The right side of FIG. 12 is a B-B' section in FIG. 11 and shows the peripheral region 120. The active region 110 is a region where elements such as diodes or transistors are formed. The peripheral region 120 is an auxiliary region positioned around the active region 110, and may have a field plate or a guard ring.

While the embodiments of the present invent o have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

In the present specification, n or p respectively means that electrons or holes are majority carriers. Also, regarding the superscript "+" or "−" placed to the right of n or p, "+" means that the carrier concentration is greater than that of those where "+" is not placed, and "−" means that the carrier concentration is less than that of those where "−" is not placed.

The operations, procedures, steps, and stages of each process performed by an device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A method of manufacturing a nitride semiconductor device, comprising:

forming, on a substrate, a first laminated body where a first nitride semiconductor layer, a second nitride semiconductor layer, and a third nitride semiconductor layer that is GaN are laminated in this order;

subsequent to the forming, removing a partial region of the third nitride semiconductor layer;

subsequent to the removing, implanting ions to the first nitride semiconductor layer from the partial region where the third nitride semiconductor layer is removed at least through the second nitride semiconductor layer; and subsequent to the implanting the ions, annealing the first laminated body.

2. The method of manufacturing a nitride semiconductor device according to claim 1, wherein the first nitride semiconductor layer is $Al_xGa_{1-x}N(0 \leq x < 0.5)$, the second nitride semiconductor layer is $Al_yGa_{1-y}N$ $(0.5 \leq y \leq 1)$.

3. The method of manufacturing a nitride semiconductor device according to claim 1, wherein the third nitride semiconductor layer has a thickness no less than twice that of the second nitride semiconductor layer, and a thickness of the first nitride semiconductor layer is greater than the thickness of the third nitride semiconductor layer.

4. The method of manufacturing a nitride semiconductor device according to claim 1, wherein
the second nitride semiconductor layer has a thickness of no less than 3 nm and no greater than 100 nm.

5. The method of manufacturing a nitride semiconductor device according to claim 1, wherein
the forming comprises epitaxially forming the second nitride semiconductor layer on the first nitride semiconductor layer.

6. The method of manufacturing a nitride semiconductor device according to claim 1, wherein
the forming comprises continuously forming the first nitride semiconductor layer, the second nitride semiconductor layer and the third nitride semiconductor layer on the substrate by an epitaxial growth method.

7. The method of manufacturing a nitride semiconductor device according to claim 1, wherein
the removing comprises removing the partial region of the third nitride semiconductor layer until the second nitride semiconductor layer is exposed.

8. The method of manufacturing a nitride semiconductor device according to claim 1, further comprising:
prior to the annealing, forming the second nitride semiconductor layer and the third nitride semiconductor layer in this order under the substrate.

9. The method of manufacturing a nitride semiconductor device according to claim 1, wherein
the removing comprises:
removing the partial region of the third nitride semiconductor layer until the second nitride semiconductor layer is exposed, and
removing another region of the third nitride semiconductor layer without causing the second nitride semiconductor layer to be exposed.

10. The method of manufacturing a nitride semiconductor device according to claim 1, wherein
the forming comprises further forming, on the first laminated body, one or more of second laminated bodies where the second nitride semiconductor layer and the third nitride semiconductor layer are laminated in this order, and
the removing comprises removing the partial region of the third nitride semiconductor layer after the second laminated body on the partial region is all removed.

11. A method of manufacturing a nitride semiconductor device, comprising:
forming, on a substrate, a first laminated body where a first nitride semiconductor layer, a second nitride semiconductor layer, and a third nitride semiconductor layer are laminated in this order;
subsequent to the forming, removing a partial region of the third nitride semiconductor layer;
subsequent to the removing, implanting ions to the first nitride semiconductor layer from the partial region where the third nitride semiconductor layer is removed at least through the second nitride semiconductor layer;
subsequent to the implanting the ions, annealing the first laminated body; and
subsequent to the annealing, removing all of the second nitride semiconductor layer and the third nitride semiconductor layer which are in an active region.

12. The method according to claim 11, wherein
the removing all of the second nitride semiconductor layer and the third nitride semiconductor layer is not performed in a peripheral region.

* * * * *